USOO5683918A

United States Patent [19]
Smith et al.

[11] Patent Number: 5,683,918
[45] Date of Patent: Nov. 4, 1997

[54] METHOD OF MAKING SEMICONDUCTOR-ON-INSULATOR DEVICE WITH CLOSED-GATE ELECTRODE

[75] Inventors: Jeremy C. Smith; James W. Miller, both of Austin, Tex.

[73] Assignee: Motorola, Inc., Schaumburg, Ill.

[21] Appl. No.: 625,861

[22] Filed: Apr. 1, 1996

[51] Int. Cl.⁶ .................... H01L 21/265; H01L 21/84
[52] U.S. Cl. .................. 437/21; 437/41; 257/347; 257/350; 257/355
[58] Field of Search ............... 437/21, 41, 186; 257/347, 350, 355, 356

[56]  References Cited

U.S. PATENT DOCUMENTS

| | | | |
|---|---|---|---|
| 4,063,274 | 12/1977 | Dingwall | 357/53 |
| 4,173,022 | 10/1979 | Dingwall | 357/23 |
| 4,272,881 | 6/1981 | Angle | 29/571 |
| 4,274,193 | 6/1981 | Angle | 29/571 |
| 4,423,431 | 12/1983 | Sasaki | 357/41 |
| 4,965,213 | 10/1990 | Blake | 437/21 |
| 4,989,057 | 1/1991 | Lu | 357/23.7 |
| 5,372,959 | 12/1994 | Chan | 437/41 |
| 5,374,573 | 12/1994 | Cooper et al. | 437/41 |
| 5,399,507 | 3/1995 | Sun | 437/24 |
| 5,567,968 | 10/1996 | Tsuruta et al. | 257/356 |
| 5,578,513 | 11/1996 | Maegawa | 437/40 |
| 5,580,802 | 12/1996 | Mayer et al. | 437/40 |
| 5,616,935 | 4/1997 | Koyama et al. | 257/69 |

OTHER PUBLICATIONS

Colinge; Silicon–on–Insulator Technology: Materials to VLSI; Kluwer Academic Publishers; pp. 102–106 (1991), month unknown.

Wolf; Silicon Processing For The VLSI ERA vol. 2: Process Integration; Lattice Press; pp. 72–75 (1990), month unknown.

Palumbo, et al.; "Design and Characterization Of Input Protection Networks For CMOS/SOS Applications;" EOS/ESD Symposium Proceedings; pp. 182–187 (Sep. 1986).

*Primary Examiner*—John Niebling
*Assistant Examiner*—Richard A. Booth
*Attorney, Agent, or Firm*—George R. Meyer

[57] ABSTRACT

A body-tied MOSFET (14) is used in a protection circuit (10) of an SOI device (20) where the MOSFET's drain regions (38) lie outside MOSFET's closed-gate electrode (34). Electrical characteristics of the body-tied MOSFET (14) can be changed by varying the ratio of the total source region area to the total body-tied region area (tie frequency). The total electrical device width is the sum of the individual source region (36) widths. More charge can be placed on the drain region (38) compared to a drain region on the inside because the interfacial area between the drain region and channel region is larger. The device (20) can be formed without having to develop new processing steps or use marginal processing steps. Body ties to an underlying substrate are unnecessary.

14 Claims, 8 Drawing Sheets

METHOD OF MAKING SEMICONDUCTOR-ON-INSULATOR DEVICE WITH CLOSED-GATE ELECTRODE

RELATED APPLICATION

This is related to U.S. patent application Ser. No. 08/625,858 filed of even date, assigned to the current assignee hereof.

FIELD OF THE INVENTION

The present invention relates to semiconductor-on-insulator (SOI) devices, and in particular, to SOI devices having protection circuits and processes for forming the devices.

BACKGROUND OF THE INVENTION

Input protection circuits are typically used in integrated circuits to protect sensitive internal circuits within the device from electrostatic discharge (ESD). The three common types of components used for ESD protection in conventional semiconductor devices (within a bulk semiconductor material) include pn junctions, metal-oxide-semiconductor field effect transistors (MOSFETs), and thick field oxide (TFO) punch-through devices. In each of these three types of components, the breakdown voltage of the component is typically determined by the breakdown voltage of a pn junction within the component. The area of the pn junction is usually adequate because the bottom plate and side edges of the diffused region that is part of the pn junction are typically adjacent to the substrate itself. Therefore, excess charge during the electrostatic discharge dissipates over a relatively large area.

The components used for ESD protection circuits for bulk semiconductor materials cannot readily be used by themselves in SOI devices. Much of the area of the pn junction is lost because the bottoms of diffused regions touch a buried oxide layer (an insulator) and are bounded on the sides by field oxide. Thus, the buried oxide layer prevents a pn junction from being formed under a p-type or n-type region. Therefore, a much smaller area has to dissipate the excess charge. An electrostatic discharge in a SOI MOSFET increases the heating of the MOSFET because the energy does not dissipate as effectively, as the buried oxide layer is a poor thermal conductor. The increased heating lowers the current threshold at which device damage can occur. The point at which this current threshold occurs is called the second-breakdown current value ($I_{t2}$) of the transistor. Once $I_{t2}$ is exceeded, the device is permanently damaged because silicon within the transistor channel melts and forms a low resistance filament after cooling. Thick field oxide devices cannot be used over a buried oxide region since the field oxide typically touches buried oxide in SOI. The result is that there is no punch-through path in which the discharge current can flow.

A need exists for an SOI device that will allow the circuit to be adequately protected from ESD potentials that may reach an input/output pad of an integrated circuit.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures are exaggerated relative to other elements to help to improve understanding of embodiment(s) of the present invention.

DETAILED DESCRIPTION

A body-tied MOSFET is used in a protection circuit of an SOI device where the MOSFET's drain regions lie outside MOSFET's closed-gate electrode. Electrical characteristics of the body-tied MOSFET can be changed by varying the ratio of the total source region area to the total body-tied region area (tie frequency). The total electrical device width is the sum of the individual source region widths. More charge can be placed on the drain region (compared to a drain region on the inside) because the interfacial area between the drain region and channel region is larger. The device can be formed without having to develop new processing steps or the use of marginal processing steps. Body ties to an underlying substrate are unnecessary.

Figure 1:
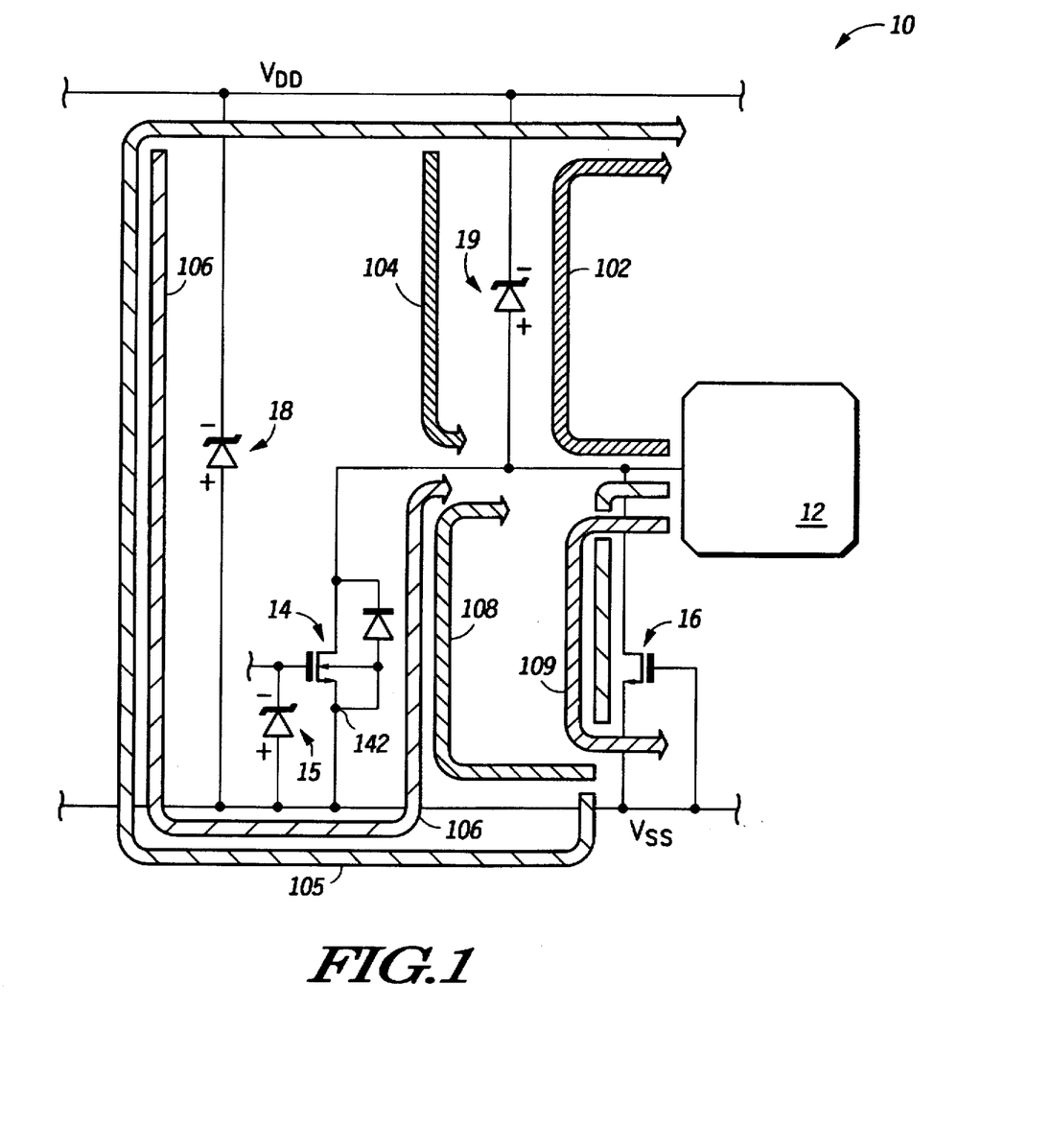
FIG. 1 includes a circuit diagram of a portion of an input protection circuit for an SOI device.

FIG. 1 is a circuit diagram of a portion of a protection circuit 10 for an input/output (I/O) pad 12 that is electrically connected to an I/O node. Within this specification, the current electrodes of MOSFETs that are electrically connected to a supply node ($V_{DD}$ or $V_{SS}$) are the sources, and the other current electrodes for those MOSFETs are the drains. The circuit 10 further includes a body-tied MOSFET 14 and an n-channel MOSFET 16. The drains of the MOSFETs 14 and 16 are electrically connected to the I/O node and the sources are electrically connected to a $V_{SS}$ node that is coupled to receive a $V_{SS}$ potential from a $V_{SS}$ electrode (not shown). In MOSFET 14, a body tie is used to electrically connect the channel region to the source region of the transistor as illustrated near node 142. The junction between the channel region and the drain region forms a diode as illustrated in FIG. 1. The gate of MOSFET 16 is electrically connected to the $V_{SS}$ node. Those skilled in the art appreciate that MOSFET 16 is a "grounded-gate" MOSFET that relies on parasitic bipolar action between the source and drain of the MOSFET for ESD protection. The potential difference (between the source and drain of a MOSFET) at which the parasitic bipolar action starts is referred to in the industry as BVDSS.

The circuit 10 further includes zener diodes 15, 18, and 19 that each have a positive terminal and a negative terminal. The positive terminal of zener diode 15 is electrically connected to the $V_{SS}$ node and the negative terminal is electrically connected to the gate of MOSFET 14. The positive terminal of zener diode 18 is electrically connected to the $V_{SS}$ node and the negative terminal is electrically connected to a $V_{DD}$ node that is coupled to receive a $V_{DD}$ potential from a $V_{DD}$ electrode (not shown). For zener diode 19, the positive terminal is electrically connected to the I/O node and the negative terminal is electrically connected to the $V_{DD}$ node.

In one embodiment, the $V_{DD}$ potential is approximately 2.0 volts, and the $V_{SS}$ potential is approximately 0.0 volts. Each of the MOSFETs 14 and 16 has a threshold voltage of approximately 0.5 volts. MOSFET 14 has a breakdown voltage of approximately 7.0 volts, and MOSFET 16 has a breakdown voltage of approximately 3.5 volts. The specific numbers are meant to illustrate and not limit the invention.

The protection circuit 10 is used to protect digital circuits under a variety of ESD conditions. The primary discharge paths are indicated by paths 102, 104, 106, 108, and 109. Current flows as illustrated by path 102 when the potential of the I/O pad 12 is higher than that of the VDD node. Diode 19 has a forward cut-in potential of approximately 0.7 volts. Therefore, current flows as shown by path 102 when the potential of the I/O pad 12 is more than 0.7 volts higher than the potential of the $V_{DD}$ node. If the $V_{DD}$ node is at approximately 2.0 volts, current flows as shown by path 102 when the I/O pad 12 is at approximately 2.7 volts or higher.

Paths 104 and 106 illustrate current flow when the potential of the I/O pad 12 is significantly less that the $V_{DD}$ node. Current flows as shown by 104 when the difference of the potential of the I/O pad 12 minus the potential of the $V_{DD}$ node exceeds the reverse breakdown voltage of diode 19 (VRBD19), which is approximately −5 volts. If the $V_{DD}$ node is at approximately 2.0 volts, current will flow as shown by path 104 when the I/O pad 12 is approximately −3.0 volts. Current flows as shown by path 106 when the potential difference of the I/O pad 12 minus the $V_{DD}$ node exceeds the sum of the reverse breakdown voltage of diode 18 (VRBD18) and the forward cut-in potential of the drain diode of MOSFET 14. Using numbers, this potential difference is approximately −5.7 volts. If the $V_{DD}$ node is at approximately 2.0 volts, current will flow as shown by path 106 when the I/O pad is approximately −3.7 volts.

In protection circuit 10, paths 108 and 109 illustrate current flow when the I/O pad 12 is at a potential higher and lower than the potential of the $V_{SS}$ node. Drain diode of MOSFET 14 has a forward cut-in potential of approximately 0.7 volts. Current flows as illustrated by path 108 when the potential of the $V_{SS}$ node is more than 0.7 volts higher than the potential of the I/O pad 12. If the $V_{SS}$ node is at approximately 0 volts, current flows as shown by path 108 when the I/O pad 12 is approximately −0.7 volts or lower. Current flows as illustrated by path 109 when the potential difference of the I/O pad 12 minus the $V_{SS}$ node exceeds BVDSS for MOSFET 16, which is approximately 3.5 volts. If the $V_{SS}$ node is at approximately 0 volts, current flows as shown by path 109 when the I/O pad 12 is approximately 3.5 volts or higher.

Because MOSFET 14 is a body-tied transistor, paths 106 and 108 would not exist at the potentials specified above.

The body tie of MOSFET 14 increases the BVDSS of MOSFET 14 compared to the same transistor without the body tie. This helps make path 109 a primary path through MOSFET 16 rather than parallel paths through MOSFETs 14 and 16 or a primary path from the I/O pad 12 to the $V_{SS}$ node through MOSFET 14. MOSFET 16 is specifically optimized to pass the high currents associated with ESD events. The optimizations needed for MOSFET 16 are, in general, contrary to those needed for good electrical performance of MOSFET 14. It is advantageous to ensure that BVDSS will occur initially in MOSFET 16 and that MOSFET 14 will not breakdown within the operating range of MOSFET 16. The significance of body-tie frequency is discussed later.

Although a number of specific potentials are discussed, those skilled in the art can tailor the potentials for the specific supply potentials and components to be protected. For example, much of the discussion has been focused on a 2.0 volt potential difference between VDD and VSS. If the potential difference between VDD and VSS is 1.0 volt, the components within the protection circuit 10 may be required to operate at potentials having values closer to zero.

In other embodiments, a pad operates at a potential that is not in the range of the $V_{DD}$ and $V_{SS}$ potentials. For example, the pad operates in the range of $V_{SS}$ and $-V_{PP}$ potentials, the latter of which could be about −2.0 volts. The circuit shown in FIG. 1 can be used, but the $V_{DD}$ node shown in FIG. 1 is at the $V_{SS}$ potential, and the $V_{SS}$ node shown in FIG. 1 is at the $-V_{PP}$ potential. Also, the electrical characteristics of the components shown in FIG. 1, such as breakdown voltages, BVDSS, etc., may need to be changed to adequately protect internal circuitry. More generally, the supply node closer to the bottom of FIG. 1 is at a lower potential than the supply node closer to the top of FIG. 1.

Figure 2:
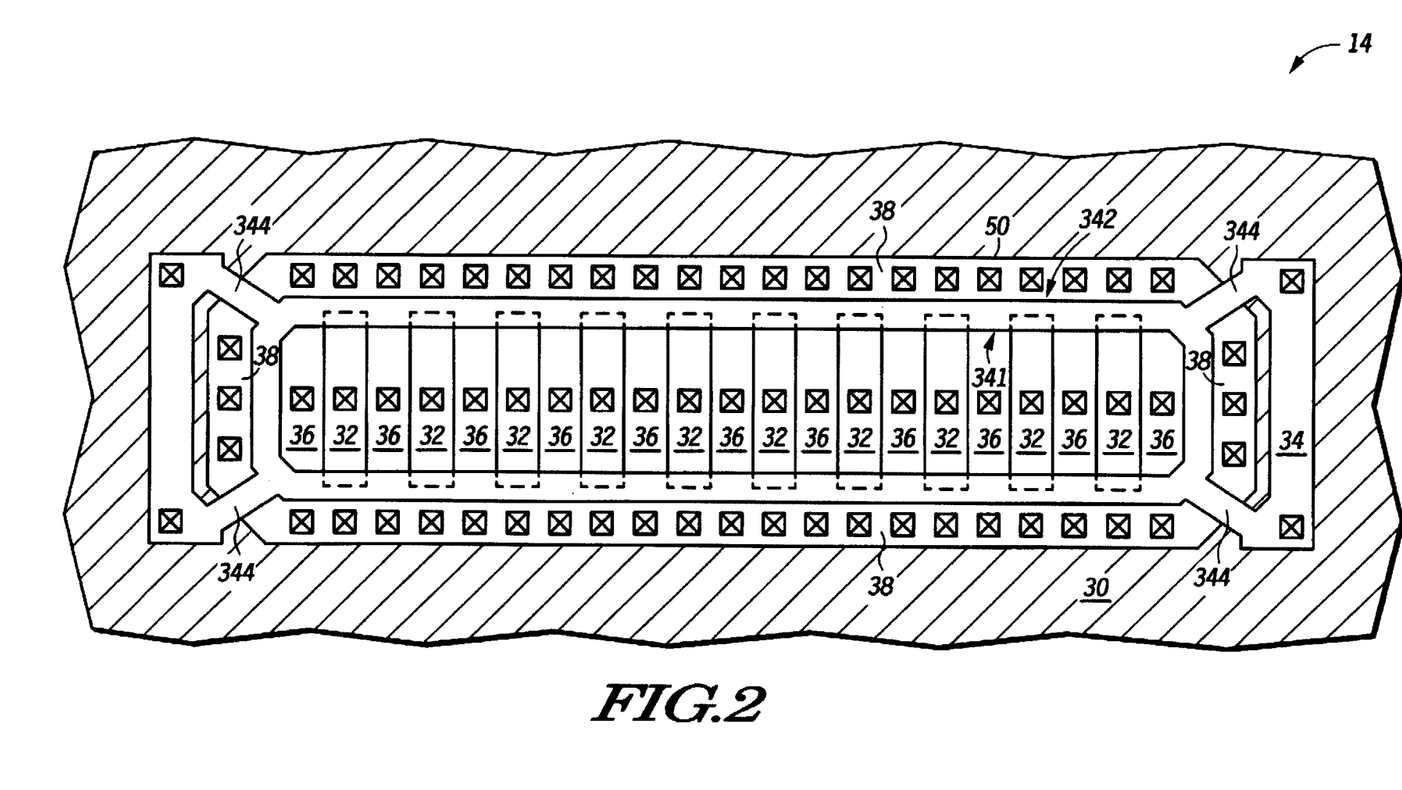
FIG. 2 includes a top view of a body-tied MOSFET as used in the input protection circuits of FIG. 1 in accordance with an embodiment of the present invention.

The inventors have discovered a layout of transistor 14 that works particularly well with the device. FIG. 2 includes an illustration of a top view of the body-tied MOSFET 14 illustrated in FIG. 1. A closed-gate electrode 34 overlies a field isolation region 30 and a semiconductor island 50. The shape of the closed-loop gate electrode can be circular, oval, elliptical, convex, or any polygon type of shape including square, rectangular, hexagonal, octagonal, etc. The closed-gate electrode 34 is used to reduce leakage current because the gate electrode 34 does not cross over a channel-field isolation edge because the MOSFET 14 does not have a channel-field isolation edge. Note that the portions of the silicon island 31 that underlie sections 344 of the closed-gate electrode 34 are not channel regions because drain regions 38 lie adjacent to opposite sides of the closed-gate electrode 34.

As seen in FIG. 2, the closed-gate electrode 34 has an inner edge 341 and an outer edge 342. The source regions 36 and body-tie regions 32 lie adjacent to the inner edge 341, and the drain regions 38 lie adjacent to the outer edge 342. Edges of the regions 32 and 36 near the closed-gate electrode 34 are formed self-aligned to the closed-gate electrode 34 or sidewall spacers (not shown in FIG. 4) that lie adjacent to the closed-gate electrode 34. Each of the contacts to the drain regions 38, source regions 36, body-tie regions 32, and closed-gate electrode 34 are illustrated by ⊠s.

The transistor 14 has an effective (electrically measured) channel length of about 0.9 microns and an effective channel width of about 200 microns. As used in this specification, the effective channel length is approximately the distance between one of the drain regions 38 and its closest the source region 36 underneath the gate electrode 34. The effective channel width is approximately the sum of individual channel regions near the individual source regions 36. The source regions 36 and body ties 32 will be electrically connected to one another.

Many conventional MOSFETs that have closed-gate electrodes place the drain region, as opposed to the source region, near the inner edge of the gate electrode. When the drain region is near the inner edge of the gate electrode, the junction capacitance of the drain region is lower because the junction area between the drain region and channel region is smaller. Lower junction capacitance generally forms a faster MOSFET.

Contrary to conventional wisdom, the drain regions 38 are adjacent to the outer edge 342 of the closed-loop gate electrode 34. The placement of the drain region adjacent to the outer edge 342 allows a higher potential to be placed on the drain regions 38 before there is a significant leakage current between the drain and channel regions.

Figure 3:
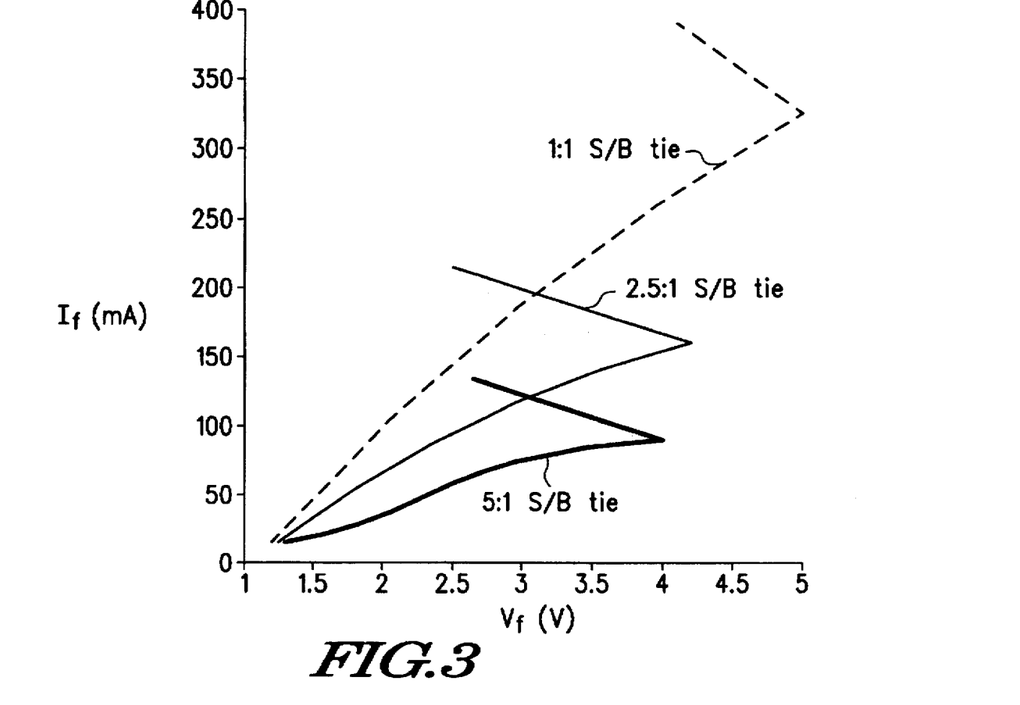
FIG. 3 includes a plot of forward bias voltage versus current of the transistor drain diode as the tie-frequency of a body-tied MOSFET is varied.

The body-tied MOSFET 14 includes a drain diode that is formed where the channel region and drain region meet. The destructive breakdown current of the forward biased drain diode can be varied by changing the ratio of the individual source region area to the body-tie region area (tie frequency). In FIG. 3, a plot of forward bias voltage ($V_f$) versus forward bias current ($I_f$) is illustrated for three different body-tie ratios. This data is for a MOSFET that has a total electrical width of 25 microns (i.e., the sum of the individual source region 36 widths). The drain diode is approximately 50 microns long. When the S/B tie ratio is 1:1, a current of approximately 6 milliamps/micron is passed before destructive failure. At S/B tie ratio of 2.5:1, approximately 4.6 milliamps/micron is passed before failure (36 microns of drain diode), and at S/B tie ratio of 5:1, approximately 4.0 milliamps/micron is passed (31 microns of drain diode). As can be seen in FIG. 3, the current carrying ability can be increased by increasing the tie frequency. This is in part due to more available drain diode area, but also a reduction in series resistance of the diode that reduces resistive heating.

Figure 4:
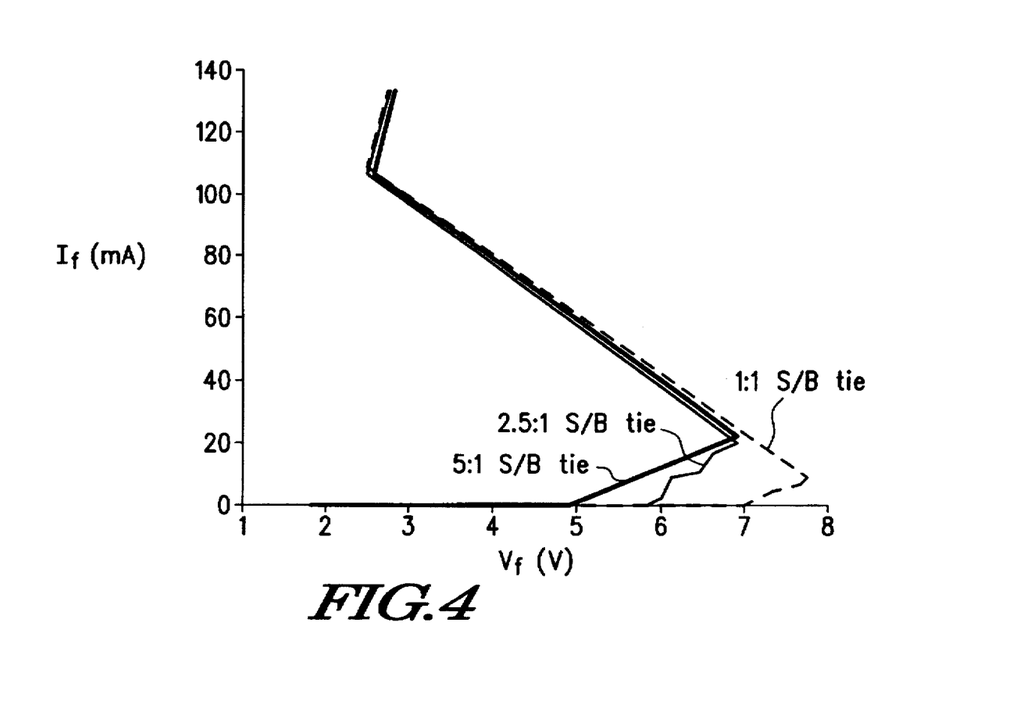
FIG. 4 includes a plot of the gate-grounded breakdown voltage characteristics (BVDSS) of a MOSFET as the tie-frequency is varied.

FIG. 4 illustrates how the S/B tie ratio affects the breakdown voltage of a reversed biased drain diode of a MOSFET. The breakdown voltage is the voltage of the drain ($V_r$) when $I_r$ is greater than zero. At an S/B tie ratio of 1:1, the breakdown of the drain diode occurs at a potential of approximately 7.0 volts. $V_r$ is approximately 5.8 volts at S/B tie ration of 2.5:1, and $V_r$ is approximately 4.9 volts at S/B tie ratio of 5:1.

In the future, $V_{DD}$ potentials will become closer to zero. As the $V_{DD}$ potential decreases, the S/B tie ratio should be increased. However, if the S/B tie ratio gets too large, the benefit of the body ties may become too small because one body tie has too much channel region to tie. An S/B tie ratio of 10:1 may be a practical upper limit, but this number is not meant to be limiting to the present invention.

Figure 5:
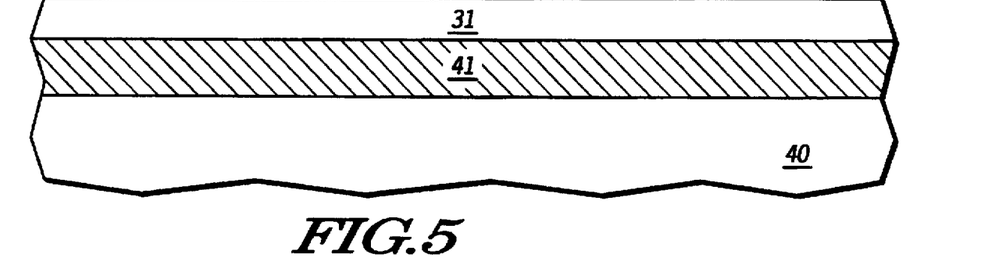
FIG. 5 includes an illustration of a cross-sectional view of a portion of a SOI semiconductor substrate, which includes a thin top silicon layer, a buried insulator layer, and a semiconductive base material.

Attention is directed to the process for forming the semiconductor device including the body-tied transistor 14. Oxygen or nitrogen ions are implanted within a semiconductive base material 40 (i.e., a p-type (100) monocrystalline silicon wafer) at an energy in a range of approximately 100–150 KeV to a dose of at least 1E16 ions per square centimeter and usually on the order of 1E18 ions per square centimeter. Heat is typically applied to the semiconductor base material 40 during implantation to maintain crystallinity. The substrate is annealed at a temperature in a range of approximately 1000–1200 degrees Celsius for a time in a range of approximately 1–5 hours. These steps form a buried insulator layer 41 and a p-type monocrystalline silicon layer 31 having a thickness of less than approximately 2000 Å and more typically in a range of approximately 500–1000 Å thick. In an alternative embodiment, the substrate in FIG. 5 could be formed by a conventional wafer-wafer bonding technique. In still an alternate embodiment, the silicon layer 31 is formed over a sapphire substrate.

Figure 6:
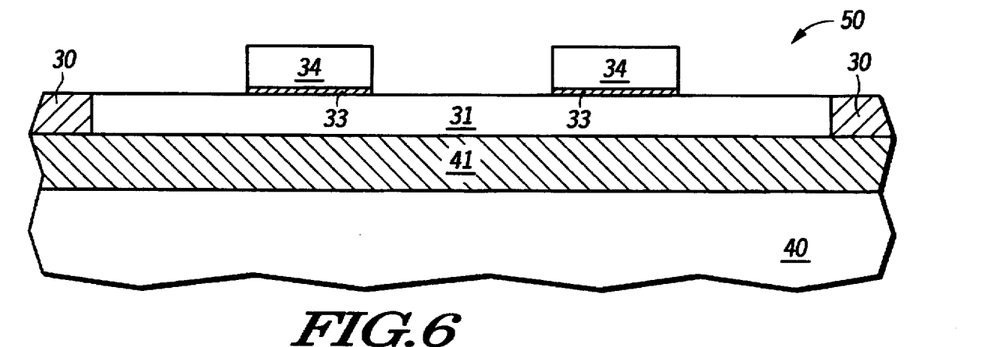
FIG. 6 includes an illustration of a cross-section view of the substrate of FIG. 5 after forming gate electrodes.

Field isolation regions 30 are formed as illustrated in FIG. 6. Although trench-type field isolation regions 30 are illustrated, other field isolation processes can be used. At this point in the process, the silicon layer 31 has been separated into several silicon islands 31, of which one is shown in FIG. 6. A gate dielectric layer 33 is formed over the silicon island 50. The gate dielectric layer 33 has thickness less than 100 Å and usually is in a range of approximately 40–80 Å.

A silicon layer is formed over the gate dielectric layer 33 by depositing a polycrystalline silicon (polysilicon) or amorphous silicon. The silicon layer is doped in-situ or doped during a separate doping step. The silicon layer and gate dielectric layer 33 are patterned using a conventional patterning method to form the closed-gate electrode 34 as seen in FIG. 6.

Figure 7:
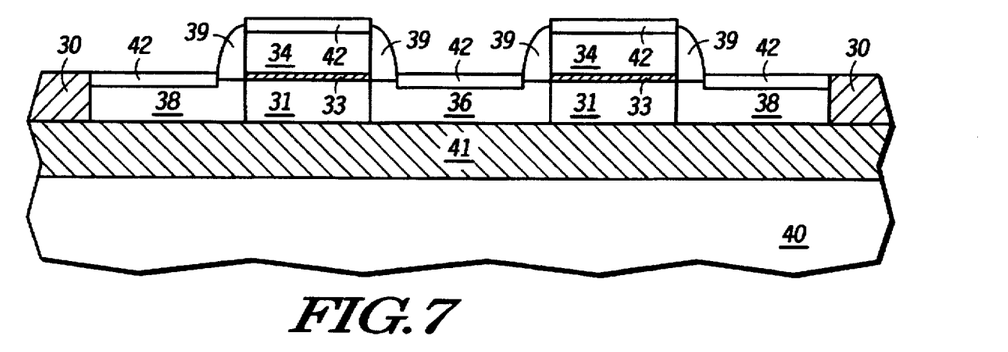
FIGS. 7 and 8 include illustrations of cross-sectional views of the substrate of FIG. 6 after forming source, drain, and body-tie regions.
Figure 8:
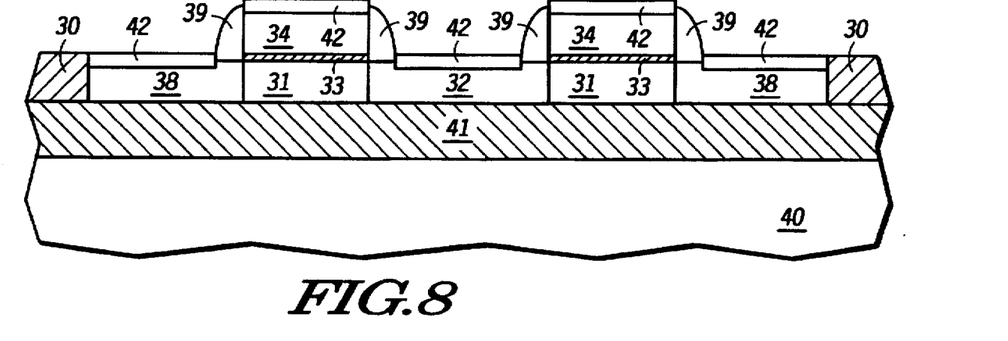

Sidewall spacers 39 are formed adjacent to the gate electrode 34 by conformally depositing and anisotropically etching a layer including oxide, nitride, or the like as shown in FIGS. 7 and 8. A mask (not shown) is formed over portions of MOSFET 14. Referring to FIG. 2, body-tie regions 32 and portions of the closed-gate electrode 34 that lie within the dashed lines are covered by the mask. After the mask is formed, source regions 36 and drain regions 38 are formed for MOSFET 14. Two of the drain regions 38 are seen in FIGS. 7 and 8, and one of the source regions 36 is seen in FIG. 7. The doping is typically performed by ion implanting arsenic, phosphorus, or the like. The source and drain regions 36 and 38 have a dopant concentration of at least 1E19 atoms per cubic centimeter. The energy of the ion implant is chosen such that a significant amount of dopant is not implanted through the closed-gate electrode 34. The mask is then removed.

Another mask (not shown) is formed over portions of MOSFET 14. This mask is essentially an inverse image of the prior mask. Referring to FIG. 2, only the body-tie regions 32 and portions of the closed-gate electrode 34 that lie within the dashed lines are not covered by the mask. After the mask is formed, body-tie regions 32 are formed for MOSFET 14. One of the body-tie regions 32 is seen in FIG. 8. The doping is typically performed by ion implanting boron, boron difluoride, or the like. The source and body-tie regions 32 have a dopant concentration of at least 1E19 atoms per cubic centimeter. The energy of the ion implant is chosen such that a significant amount of dopant is not implanted through the closed-gate electrode 34. The mask is removed after the implant.

Titanium is deposited and reacted to form a self-aligned titanium disilicide (titanium salicide) layer 42. The titanium salicide layer 42 is formed over the gate electrode 34, source regions 36, drain regions 38, and body-tie regions 32. The titanium salicide layer 42 that forms over the source regions 36 and body-tie regions 32 is a conductive strap that electrically connects the source regions 36 and the body-tie regions 32 to one another. Besides titanium salicide, other metal-containing materials, such as titanium nitride, tungsten silicide, cobalt silicide, and the like, can be used. Usually, refractory metal-containing materials are used.

Figure 9:
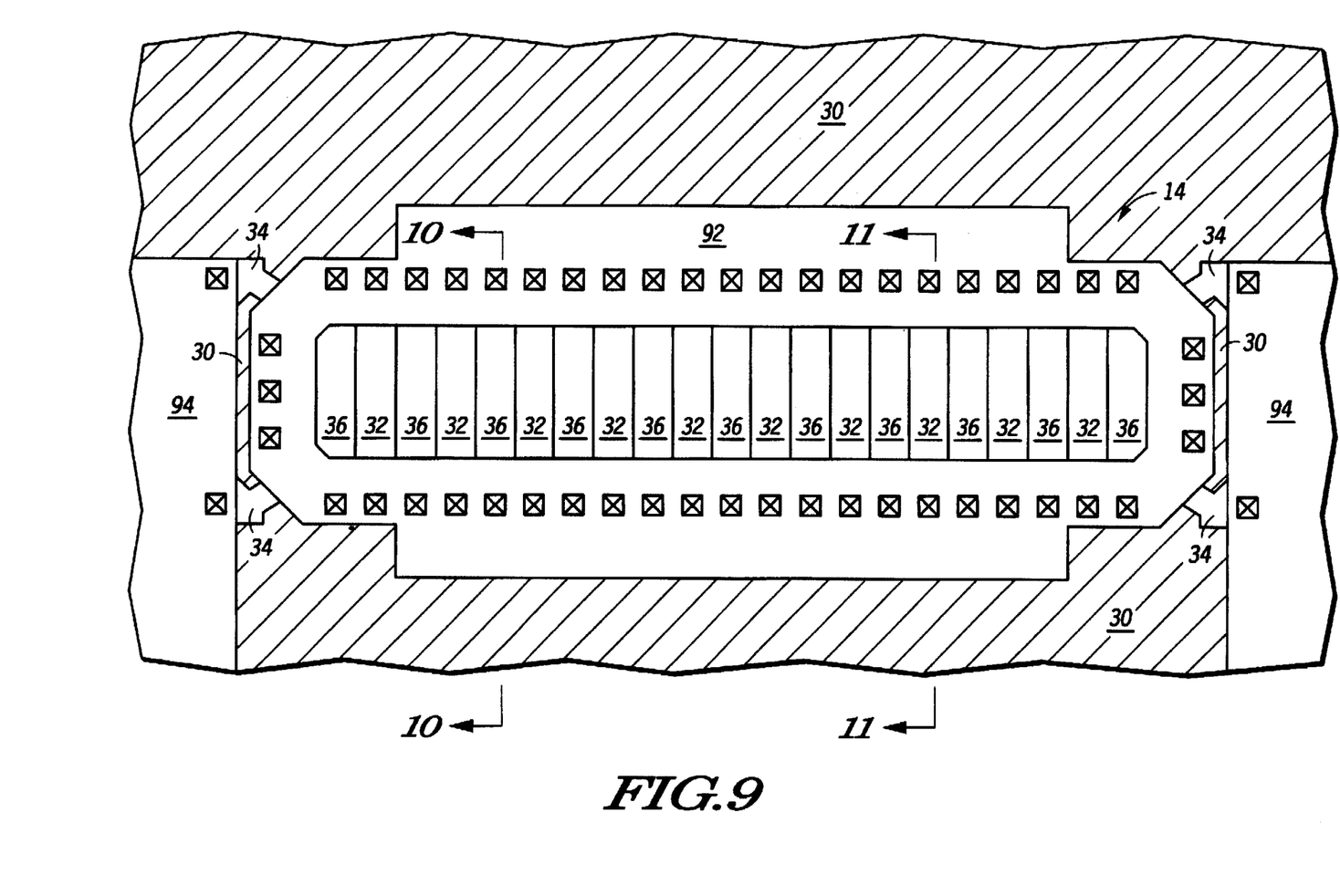
FIGS. 9, 10, and 11 include illustrations of top and cross-sectional views of the substrate of FIGS. 7 and 8 after forming a first level of interconnects.
Figure 10:
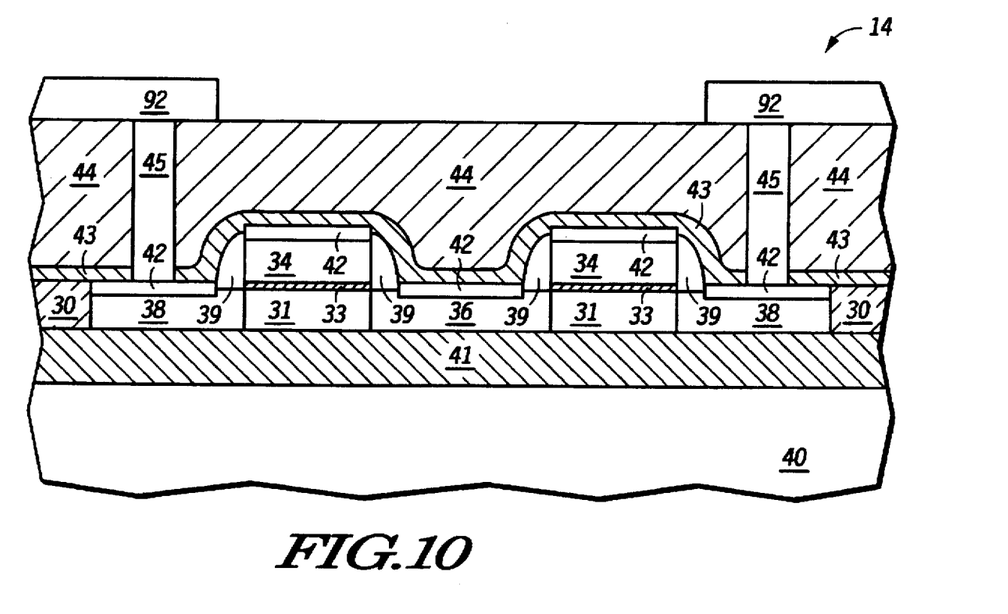
Figure 11:
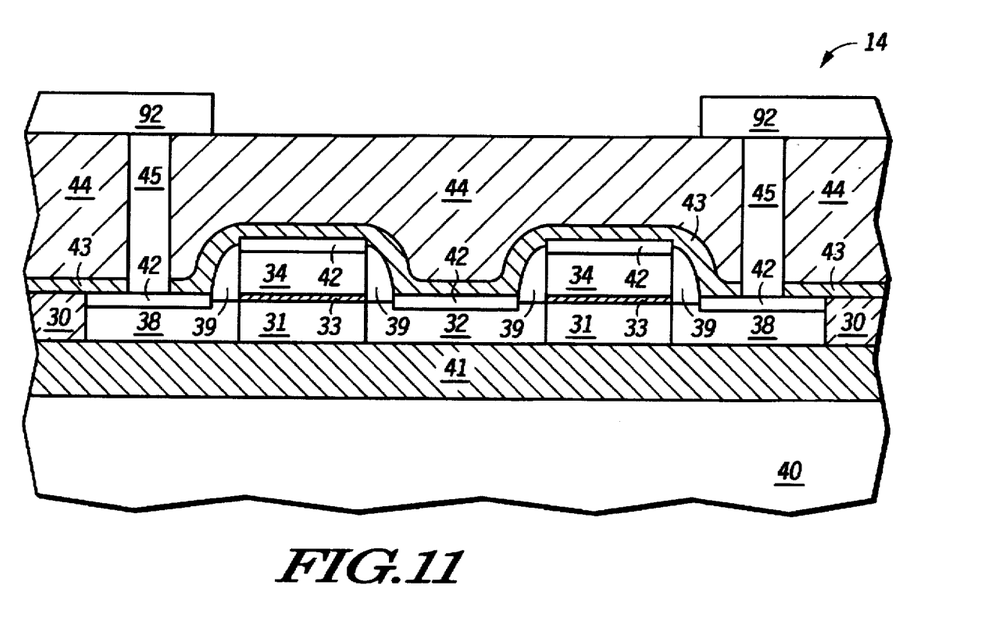

A first level of interconnects is formed as shown in FIGS. 9, 10, and 11. An undoped insulating layer 43 and a doped insulating layer 44 are formed as shown in FIGS. 10 and 11. Openings are formed through the insulating layers 43 and 44, and conductive plugs 45 are formed within the openings. Conductive plugs 45 are formed to the gate electrode 34 and drain regions 38 and are illustrated by ⊠s in FIG. 9. Drain interconnect 92 and gate interconnects 94 are formed over the conductive plugs 45 and the doped insulating layer 44. In FIG. 9, the sidewall spacers 39, titanium salicide layer 42, undoped insulating layer 43, and doped insulating layer 44 are not illustrated to aid in understanding positional relationships between the interconnects 92 and 94 and other portions of MOSFET 14.

Figure 12:
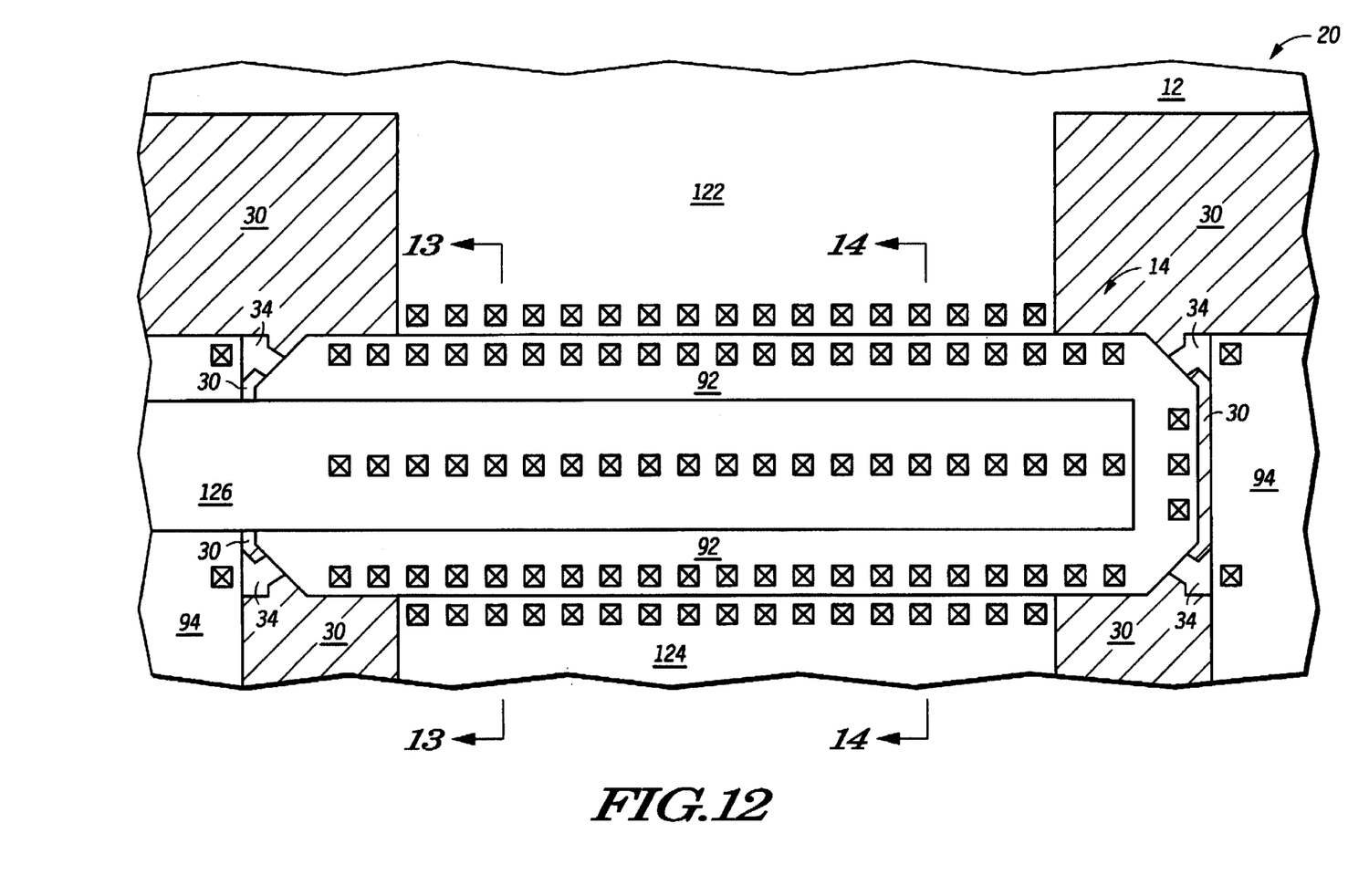
FIGS. 12, 13, and 14 include illustrations of top and cross-sectional views of the substrate of FIGS. 9, 10, and 11 after forming a substantially completed device.
Figure 13:
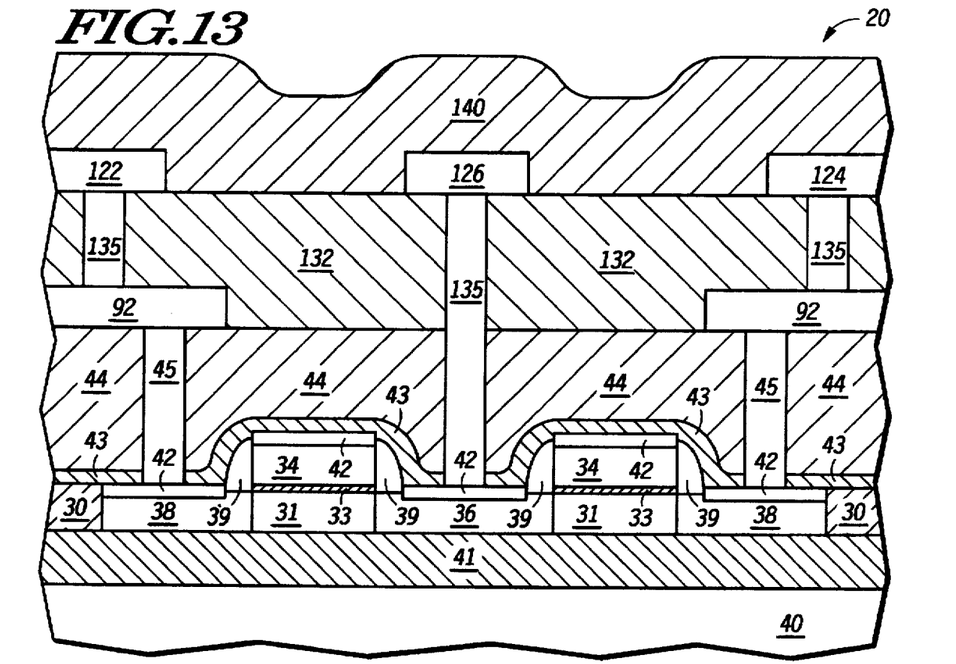
Figure 14:
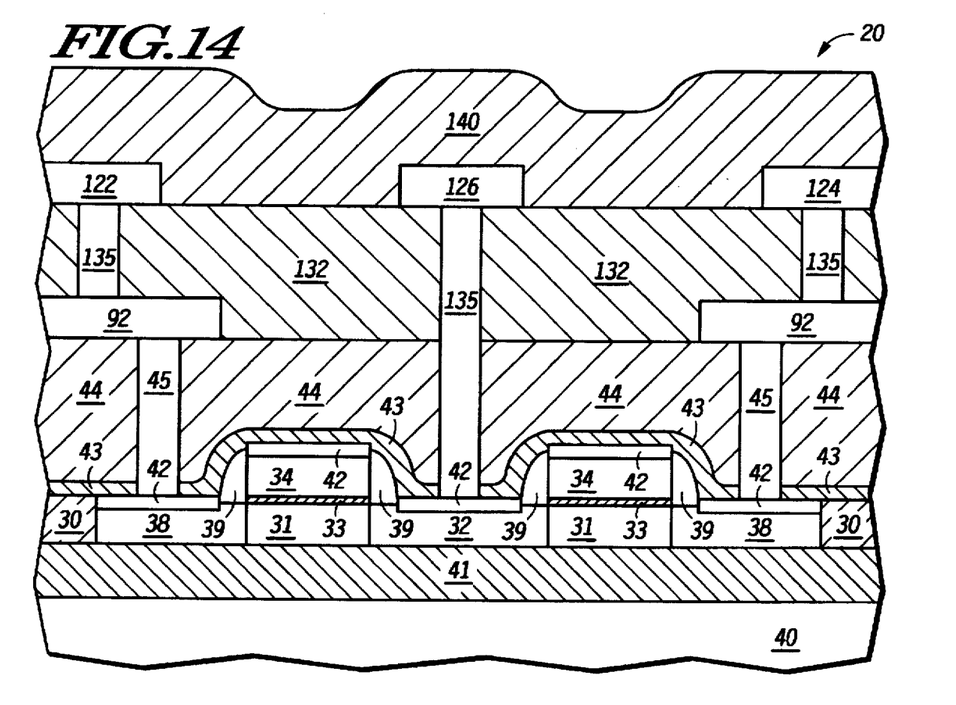

Processing continues to form a substantially completed device 20 in FIGS. 12, 13, and 14. An insulating layer 132 is formed as shown in FIGS. 13 and 14. The insulating layer can be doped or undoped or be a composite of films. Openings are formed through the insulating layer 132, and conductive plugs 135 are formed within the openings. Conductive plugs 135 are formed to the source regions 36, body-tie regions 32, and interconnects 92 and 94 and are illustrated by ⊠s in FIG. 12. Input/output (I/O) pad 12 and interconnects 122, 124, and 126 are formed over the insulating layer 132. A passivation layer 140 is formed over the I/O pad 12 and interconnects 122, 124, and 126 and insulating layer 132. In FIG. 12, the sidewall spacers 39, titanium salicide layer 42, undoped insulating layer 43, doped insulating layer 44, insulating layer 132, and passivation layer 140 are not illustrated to aid in understanding positional relationships between the I/O pad 12, interconnects 122, 124, and 126, and other portions of MOSFET 14.

As illustrated in FIG. 12, I/O pad 12 and interconnect 122 are one continuous piece of material. Interconnects 94 are electrically connected to the negative terminal of zener diode 15 and other portions of the device. Interconnect 124 is electrically connected to the drain of MOSFET 16 and positive terminal of zener diode 19. Interconnect 126 is electrically connected to a VSS electrode.

Additional insulating layers and interconnect levels can be used, if needed. Each of the interconnects in the preceding paragraph can be replaced by a combination of interconnects to serve the same interconnecting function. The I/O pad 12 is typically formed in the only or uppermost interconnect level. The configuration used depends on the size of the components and the layout of the device and pads.

The embodiments of the present invention allow an input protection circuit to be used with a SOI device to properly protect the digital circuits or other sensitive components from electrostatic events from an I/O pad. The design allows the I/O pad to reach high voltages without adversely affecting the internal circuit that is to be protected. As used in this specification, high voltage means that the absolute value of the voltage (or potential) is at least ten percent higher than the voltage of the highest potential power supply for the device. For example, if a device has five volt and 12 volt power supplies, high voltage is at least 13.2 volts. Electrostatic events are transient high voltage conditions that typically last no longer than 150 nanoseconds.

During an electrostatic event, current can flow between the I/O pad 12 and $V_{DD}$ under both negative and positive biasing conditions, as well as, between the I/O pad 12 and $V_{SS}$ under negative and positive biasing conditions, and between any combination of two I/O pads. The design does not require ties through the buried insulator layer 41 to the underlying semiconductive base material 40. Therefore, a truly SOI device including input protection circuits is formed. Another benefit of the present invention is that it can be integrated into a process flow without the incorporation of marginal or difficult process steps.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. In the claims, means-plus-function clause(s), if any, cover the structures described herein that perform the recited function(s). The mean-plus-function clause(s) also cover structural equivalents and equivalent structures that perform the recited function(s).

We claim:

1. A process for forming a semiconductor-on-insulator device comprising the steps of:

providing a substrate having a semiconductor island, wherein the semiconductor island has a first conductivity type and sides and a bottom of the semiconductor island are surrounded by insulating material;

forming a closed-gate electrode over the semiconductor island, wherein the closed-gate electrode has an inner edge and an outer edge;

forming a plurality of body-tie regions with a first dopant having the first conductivity type, wherein the plurality of body-tie regions lies adjacent to the inner edge; and forming a plurality of source regions and a drain region with a second dopant having a second conductivity type that is opposite the first conductivity, type, wherein the plurality of source regions lies adjacent to the inner edge, and the drain region lies adjacent to the outer edge, wherein the semiconductor-on-insulator device has a body-tied transistor that includes the closed-gate electrode, the plurality of body-tie regions, the plurality, of source regions, and the drain region.

2. The process of claim 1, the step of providing comprises steps of:

implanting a semiconductive base material with oxygen ions;

annealing the semiconductive base material to form an insulating layer and a semiconductor layer over the insulating layer; and forming field isolation regions within the semiconductor layer to form the semiconductor island.

3. The process of claim 1, wherein the steps of forming the plurality of body-tie regions and forming the plurality of source regions and the drain region are performed such that:

the plurality of body-tie regions occupies a total body-tie region area;

the plurality of source regions occupies a total source region area; and a ratio of the total source region area to the total body-tie region area is less than approximately 10:1.

4. The process of claim 1, wherein the steps of forming the plurality of body-tie legions and forming the plurality of source regions and the drain region are performed such that:

the plurality of body-tie regions occupies a total body-tie region area;

the plurality of source regions occupies a total source region area; and a ratio of the total source region area to the total body-tie region area is in a range of 5:1 to 1:1.

5. The process of claim 1, wherein the steps of forming the plurality of body-tie regions and the step of forming the plurality of source regions and the drain region is performed such that each source region of the plurality of source regions lies within approximately 10 microns of another source region of the plurality of source regions.

6. The process of claim 1, wherein the steps of forming the plurality of body-tie regions and the step of forming the plurality of source regions and the drain region is performed such that each body-tie region of the plurality of body-tie regions lies within approximately 10 microns of another body-tie region of the plurality of body-tie regions.

7. The process of claim 1, wherein the step of forming the plurality of body-tie regions and the step of forming the plurality of source regions and the drain region is performed such that the plurality of source regions are electrically connected to the plurality of body-tie regions.

8. The process of claim 7, wherein the step of forming the plurality of body-tie regions and the step of forming the plurality of source regions and the drain region is performed such that the plurality of source regions, the plurality of body-tie regions, and a $V_{SS}$ electrode are electrically connected to one another.

9. The process of claim 1, further comprising a step of forming a first refractory metal-containing conductive member that electrically connects the plurality of source regions and the plurality of body-tie regions to each other.

10. The process of claim 1, further comprising a step of forming a pad electrically connected to the drain region.

11. The process of claim 9, wherein the step of forming the first refractory metal-containing member is a metal silicide or a metal nitride.

12. The process of claim 9, wherein the step of forming the first refractory metal-containing member also forms a second refractory metal-containing conductive member on the closed-gate electrode and a third refractory metal-containing conductive member on the drain region.

13. The process of claim 1, further comprising a step of forming a gate dielectric layer having a thickness less than 100 Å, wherein the body-tied transistor is part of a protection circuit.

14. The process of claim 13, wherein the gate dielectric layer has a thickness in a range of approximately 40–80 Å.

* * * * *